(12) United States Patent
Koyama

(10) Patent No.: US 8,058,966 B2
(45) Date of Patent: Nov. 15, 2011

(54) PTC THERMISTOR AND METHOD FOR PROTECTING CIRCUIT

(76) Inventor: Hiroyuki Koyama, Ibaraki (JP)

(*) Notice: Subject to any disclaimer, the term of this patent is extended or adjusted under 35 U.S.C. 154(b) by 1152 days.

(21) Appl. No.: 10/562,277

(22) PCT Filed: Jun. 22, 2004

(86) PCT No.: PCT/JP2004/009076
§ 371 (c)(1),
(2), (4) Date: May 11, 2006

(87) PCT Pub. No.: WO2004/114331
PCT Pub. Date: Dec. 29, 2004

(65) Prior Publication Data
US 2007/0057759 A1 Mar. 15, 2007

(30) Foreign Application Priority Data
Jun. 23, 2003 (JP) .................. 2003-178662

(51) Int. Cl.
*H01C 7/10* (2006.01)
(52) U.S. Cl. ........ 338/22 R; 338/328; 219/553; 252/511
(58) Field of Classification Search ............... 338/22 R, 338/25, 324, 328; 219/553; 252/511, 512
See application file for complete search history.

(56) References Cited

U.S. PATENT DOCUMENTS

| 3,974,105 | A | | 8/1976 | Sato et al. |
| 5,358,793 | A | * | 10/1994 | Hanada et al. ............ 428/560 |
| 5,940,958 | A | * | 8/1999 | Shaw et al. ............... 29/612 |
| 6,104,587 | A | * | 8/2000 | Banich et al. ............ 361/106 |
| 6,362,721 | B1 | * | 3/2002 | Chen et al. ............ 338/22 R |
| 6,445,277 | B1 | | 9/2002 | Ishikawa et al. |
| 2002/0181182 | A1 | * | 12/2002 | Hasunuma et al. ........ 361/106 |

FOREIGN PATENT DOCUMENTS

| CN | 1283304 A | | 2/2001 |
| EP | 08250304 | * | 9/1996 |
| JP | 8-250304 A | | 9/1996 |
| JP | 10-256409 A | | 9/1998 |
| JP | 06-163203 A | | 10/1998 |
| JP | 10-270217 A | | 10/1998 |
| WO | WO-02/091398 A2 | | 11/2002 |

OTHER PUBLICATIONS

Supplementary European Search Report for European Application No. 04746545.5.
International Search Report for International Application No. PCT/JP2004/009076, mailed Oct. 12, 2004.

* cited by examiner

Primary Examiner — Kyung Lee

(57) ABSTRACT

A PTC thermistor provided with a conductive member having PTC characteristics and two electrodes each placed in two different locations on the conductive member. The, conductive member and at least one of the two electrodes is bonded via an adhesive which has conductivity and which at the same time deteriorates in an overheated state and irreversibly increases the electrical resistance.

10 Claims, 2 Drawing Sheets

PTC THERMISTOR AND METHOD FOR PROTECTING CIRCUIT

FIELD OF THE INVENTION

The present invention relates to a thermistor, and a circuit protection method for protecting the circuit by use of an overcurrent protection device or a temperature protection device.

Priority is claimed from Japanese Patent Application No. 2003-178662, filed on Jun. 23, 2003, the disclosure of which is incorporated herein by reference. This is the National Stage of International Application No. PCT/JP2004/009076, filed Jun. 22, 2004, the disclosure of which is incorporated herein by reference

BACKGROUND OF THE INVENTION

A polymer PTC thermistor is a device which allows the flow of current, or which reduces current flow by using a positive resistance temperature characteristic, that is, a PTC (Positive Temperature Coefficient) of a conductive polymer which varies in conductivity due to thermal expansion. In detail, it is common that in a conductive member which is composed of a conductive polymer, ceramic or the like, the conductive member is soldered to two electrodes disposed on two separate positions thereof.

The conductive polymer is one type of material which composes the conductive member. The conductive polymer is a polymer resin prepared, for example, by kneading polyethylene and carbon black together and crosslinking thereafter with radiation. Within the conductive polymer, the carbon black particles are linked to each other in a room-temperature environment so that numerous conductive paths are formed through which current flows, and good conductivity is exhibited. However, when the conductive polymer expands thermally due to excessive current flowing in the conductive paths or an increase in the ambient temperature, the distances between the carbon black particles are increased, thus severing the conductive paths, and the resistance rises sharply. This is called the positive temperature coefficient of a conductive polymer, or PTC. This invention utilizes this characteristic.

The polymer PTC thermistor can be used as a switch using as a trigger the magnitude of current flowing between the electrodes disposed on two separate positions of the conductive member. When an overcurrent occurs between the electrodes, the conductive member thermally expands due to self-heating caused by Joule heating, and the distances between the carbon black particles are increased, thus the conductive paths are severed. As a result, it becomes difficult for current to flow. When current flow between the electrodes is cut off, the conductive member shrinks due to stoppage of the self-heating, and the distances between the carbon black particles are decreased, thus conductive paths are formed. As a result, the PTC thermistor returns to a state enabling the passage of current.

Also by utilizing the PTC characteristic of the conductive member, a PTC thermistor as described above may allow current of a prescribed size or less (called the hold current) to flow if the ambient temperature is lower than a prescribed temperature (the temperature at which the conductive member will thermally expand). If the ambient temperature reaches the prescribed temperature or higher, the conductive member will thermally expand so that it becomes difficult for current to flow. In this way, it may also function as a switch using the change in the ambient temperature in which the conductive member is placed.

Japanese Unexamined Patent Application, First Publication No. H06-163203, describes a conductive paste whose conductivity changes in response to temperature change.

When a PTC thermistor as described above is installed in a circuit, there is no occurrence of a problem when it is used in a proper state. However, it has been pointed out that if the device is activated for a long time owing to an overcurrent, or if it is placed in a very high temperature environment for a long time, the conductive member may fail and the electrode may be short-circuited.

This invention was made in view of the above circumstances and is intended to prevent a short between the two electrodes to secure the safety of the circuit.

BRIEF SUMMARY OF THE INVENTION

This invention is a PTC thermistor provided with a conductive member having PTC characteristics and two electrodes each placed in two different locations on the conductive member, characterized by the conductive member and at least one of the two electrodes being bonded via an adhesive which has conductivity and which at the same time deteriorates in an overheated state and irreversibly increases the electrical resistance.

According to the PTC thermistor as described above, when an excessive amount of current flows between the two electrodes, the conductive member first expands thermally by self-generating heat through Joule heating, so that it becomes difficult for current to flow. The conductive member continues to self-generate heat even when it becomes difficult for current to flow, so that when heat generation continues for a long time, the adhesive bonding the conductive member and the electrodes deteriorates and conductivity is decreased (as a result of the electrical resistance increasing). When the electrical resistance of the adhesive increases, the voltage that was borne primarily by the conductive member in the beginning is also borne by the adhesive. Eventually, when the electrical resistance of the adhesive becomes greater than the electrical resistance of the conductive member, the adhesive primarily bears the voltage. The thermal energy consumed by the conductive member is reduced, the tripped state is released, and self-generation of heat draws towards an end. Thus, a state where the conductive member fails is not reached and the safety of the circuit in which the PTC thermistor is installed is maintained.

Also, according to the PTC thermistor as described above, even when the conductive member is placed under a very high temperature environment for a long time and eventually fails, the adhesive will deteriorate by then and reduce its conductivity, and the adhesive between the two electrodes becomes an increased resistance and serves to reduce the current flowing between the electrodes. Thus, even when the conductive member fails, the two electrodes will not short circuit, and the safety of the circuit in which the PTC thermistor is installed is maintained.

This invention is a circuit protection method that includes a component that generates heat through the flow of excessive current, characterized by a PTC thermistor being provided on the circuit and the wiring comprising the circuit being bonded to the component in such a way as to allow current to flow using an adhesive which has conductivity and which at the same time deteriorates in an overheated state and irreversibly increases the electrical resistance.

According to the circuit protection method as described above, when excessive voltage is applied to the circuit, excessive current flows through the component so that it heats up. At the same time, excessive current flows between the two electrodes of the PTC thermistor; the conductive member comprising the PTC thermistor expands thermally by self-generating heat through Joule heat so that it becomes difficult for current to flow between the two electrodes.

When heat is generated by the above component for a long time, the adhesive bonding the component and the wiring deteriorates so that conductivity is decreased. When the electrical resistance of the adhesive increases, the voltage that was borne primarily by the conductive member in the beginning is also borne by the adhesive. Eventually, when the electrical resistance of the adhesive becomes greater than the electrical resistance of the conductive member, the adhesive primarily bears the voltage. The thermal energy consumed by the conductive member is reduced, the tripped state is released, and self-generation of heat draws towards an end. Thus, a state where the conductive member fails is not reached and the safety of the circuit in which the PTC thermistor is installed is maintained.

DETAILED DESCRIPTION OF THE INVENTION

Figure 1:
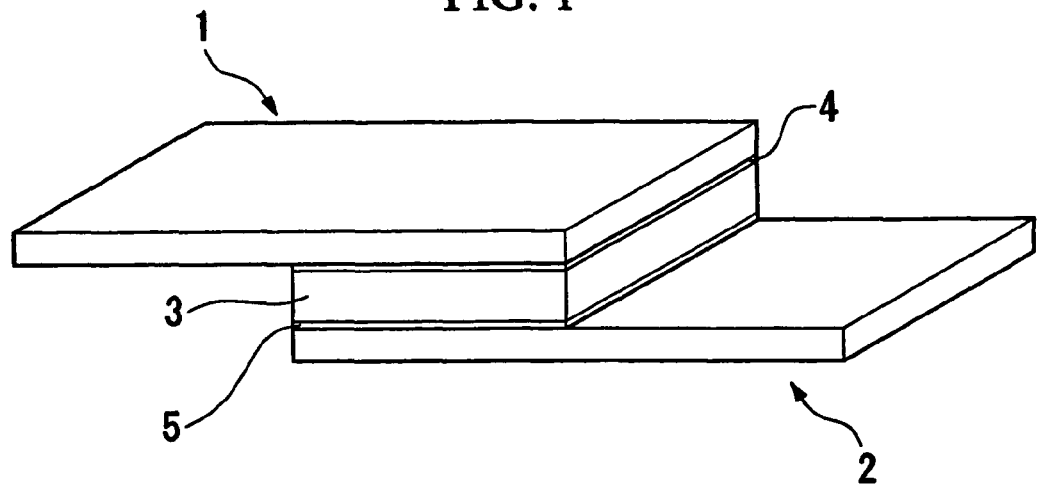
FIG. 1 shows a first embodiment of this invention, and is a perspective view of the polymeric PTC thermistor viewed from diagonally above.
Figure 2:
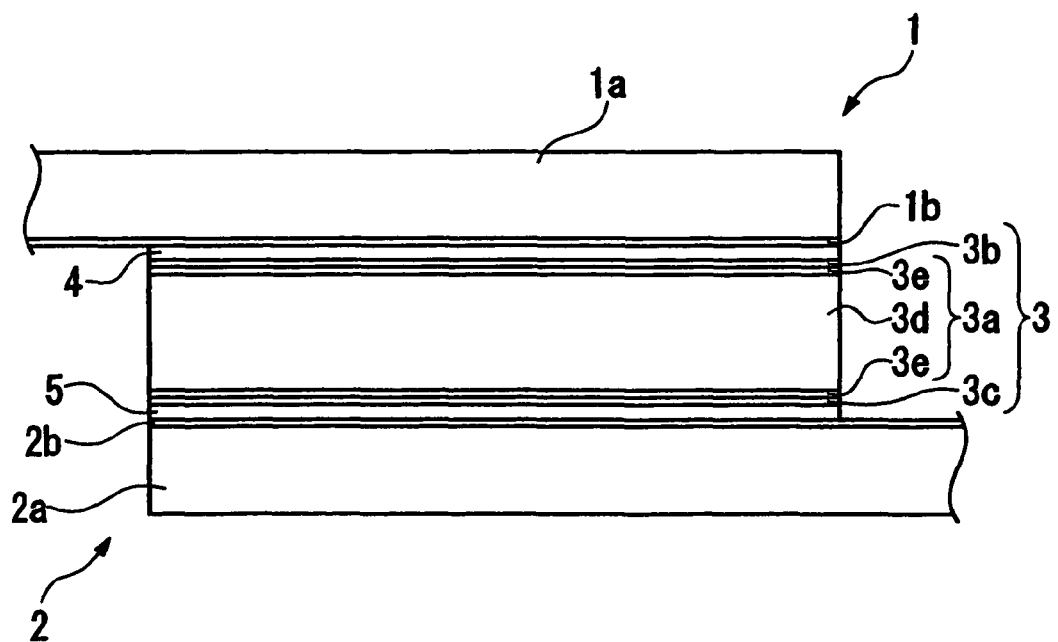
FIG. 2 also shows a first embodiment of this invention, and is an enlarged detail of the polymeric PTC thermistor viewed cross-sectionally from the side.

A first embodiment of this invention, shown in FIGS. 1 and 2, is explained.

FIG. 1 and FIG. 2 show a polymeric PTC thermistor as an overcurrent protection device. This polymeric PTC thermistor comprises two electrodes 1, 2, and a conductive member 3 sandwiched between these two electrodes 1, 2. The electrodes 1, 2 and the conductive member 3 are bonded by adhesive 4, 5 having conductivity so that the two are not directly in contact with each other.

The electrode 1 is provided on one side surface of the conductive member 3 and the electrode 2 is provided on the other side surface of the conductive member 3. From a plan view, the electrode 1 is a rectangular sheet-form with uniform thickness and has a dual-layer structure of a nickel sheet 1a covered with a gold thin-film 1b. The electrode 2 also has the same shape as the electrode 1 and has a dual-layer structure of a nickel sheet 2a covered with a gold thin-film 2b.

From a plan view, the conductive member 3 is a square sheet-form with uniform thickness and has gold thin-film 3b, 3c formed on the two surfaces of a PTC element 3a. The PTC element 3a is a conductive polymer 3d, made by kneading for example a polyolefin or a fluoropolymer and carbon black, then crosslinking by irradiation, on the two surfaces of which nickel foil 3e (or copper foil with nickel plating) is applied by compression. Within the conductive polymer 3d, carbon black particles are present and are linked to one another in a room temperature environment forming numerous conductive paths passing current so that good conductivity is exhibited. However, when the conductive polymer 3d thermally expands through excessive current flowing through the conductive paths, the distance between the carbon black particles is extended to cut the conductive paths, and the resistance increases sharply (positive temperature coefficient: PTC).

The electrode 1 and the conductive member 3 are placed so that the gold thin-films 1b, 3b face each other and are bonded by an adhesive 4 filled between the two. Similarly, the electrode 2 and the conductive member 3 are placed so that the gold thin-films 2b, 3c face each other and are bonded by an adhesive 5 filled between the two. As described above, the adhesives 4, 5 have conductivity and are further provided with a characteristic wherein it will deteriorate in an overheated state and irreversibly increase the electrical resistance. It is also provided with a characteristic wherein it does not deteriorate easily in a temperature range in which the conductive polymer 3d does not thermally expand, but will deteriorate easily in a temperature range in which the conductive polymer 3d thermally expands.

The adhesives 4, 5 have synthetic resin and conductive powder as essential components kneaded with additives for adjusting viscosity and the like added as needed. As the synthetic resin, thermoplastic resins such as vinyl acetate resin, polyvinyl alcohol resin, acrylic resin, and vinyl urethane resin may be used. Also, thermosetting resins such as urea resin, melamine resin, phenol resin, resorcinol resin, epoxy resin, silicone resin, α-olefin maleic acid anhydride resin, polyamide resin, and polyimide resin may be used. Further two or more types of the above may be blended and used. Powder having conductivity on the surface, such as gold powder, silver powder, nickel powder, or carbon powder for example may be used as the conductive powder.

The gold thin-film formed on the surfaces of the electrodes 1, 2 and the PTC element 3a prevents the surface of each part from oxidation and at the same time secures good conductivity and enhances the bond strength of the adhesives 4, 5. In addition to gold, suitable conductive material such as palladium and silver and the like may be used.

In the polymeric PTC thermistor constructed as described above, when excessive current flows between the electrodes 1, 2, the conductive polymer 3d comprising the PTC element 3a first expands thermally by self-generating heat through Joule heat, so that it becomes difficult for current to flow between the electrodes 1, 2. The conductive polymer 3d continues to self-generate heat while it is difficult for current to flow, so that when heat generation continues for a long time, the adhesives 4, 5 bonding the conductive member 3 and the electrodes 1, 2 deteriorate and their conductivity decreases (as a result of the electrical resistance increasing).

When the electrical resistance of the adhesives 4, 5 increases, the voltage that was borne primarily by the conductive polymer 3d in the beginning is also borne by the adhesives 4, 5. Eventually, when the electrical resistance of the adhesives 4, 5 becomes greater than the electrical resistance of the conductive polymer 3d, the adhesives 4, 5 primarily bear the voltage. The thermal energy consumed by the conductive polymer 3d is reduced, the tripped state is released, and self-generation of heat draws towards an end. Thus, a state where the conductive polymer 3d fails is not reached and the safety of the circuit in which the polymeric PTC thermistor is installed as well as of the apparatus incorporating the circuit is maintained.

Also in the above polymeric PTC thermistor, when the conductive polymer 3d is placed under a very high temperature environment for a long time and eventually fails, the adhesives 4, 5 will deteriorate and their conductivity will decrease, and the adhesives 4, 5 between the electrodes 1, 2 increase in resistance and serve to reduce the current flowing between the electrodes 1, 2. Thus, even when the conductive polymer 3d fails, the two electrodes will not short circuit, and the safety of the circuit in which the polymeric PTC thermistor is installed as well as of the apparatus incorporating the circuit is maintained.

In this embodiment, a polymeric PTC thermistor using conductive polymer as the conductive member has been described. However, the PTC thermistor of this invention may also use, in addition to polymer, conductive materials having PTC characteristics such as ceramic and the like as the conductive member.

Also in this embodiment, gold or other metallic thin-film was formed on the surface of the electrodes 1, 2 and the conductive polymer 3 in order to enhance the bond strength of the adhesives 4, 5. However, depending on differing compositions and the like of the adhesive used, the provision of such gold or other thin-film is not needed.

Further in this embodiment, the two electrodes 1, 2 were bonded to the conductive member 3 with adhesive. However, the PTC thermistor of this invention will have a similar effect if an adhesive is used on one electrode and another bonding means such as welding or soldering is used on the other electrode to bond to the conductive member.

The PTC thermistor of this invention is not limited to the form explained in this embodiment but may be applicable to all types of thermistors, such as surface mounted types.

Figure 3:
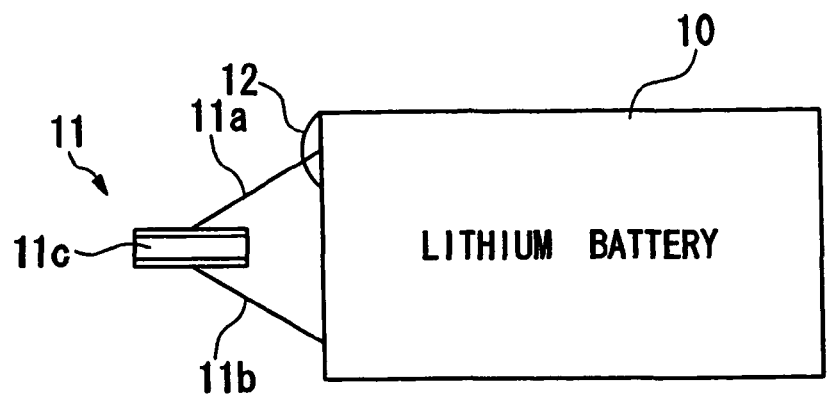
FIG. 3 shows a second embodiment of this invention, and is a plan view of a lithium battery mounted with a protection circuit.

Next, a second embodiment of this invention, shown in FIG. 3, is explained.

FIG. 3 shows a protection circuit for lithium battery. This protection circuit is provided with a lithium battery (component) 10 and a PTC thermistor 11. For the PTC thermistor 11, one having a conventional construction was adopted rather than the construction explained in the above first embodiment. One lead of the PTC thermistor 11 is connected to the wiring 11a linked to the positive electrode of the lithium battery 10, and the wiring 11a is bonded, in such a way that current will flow, to the positive electrode of the lithium battery 10 by an adhesive 12 similar to the adhesive explained in the above first embodiment. Also, the other lead of the PTC thermistor 11 is connected to the wiring 11b linked to the negative electrode of the lithium battery 10, and the wiring 11b is bonded, in such a way that current will flow, to the negative electrode of the lithium battery 10 by a bonding means such as welding or soldering and the like.

In the protection circuit as constructed above, if excessive voltage is applied while charging the lithium battery 10, excessive current flows through the lithium battery 10 to make it heat up. At the same time, current of an excessive size flows between the two electrodes of the PTC thermistor 11, the conductive polymer 11c comprising the PTC thermistor 11 expands thermally by self-generating heat through Joule heating so that it becomes difficult for current to flow between the two electrodes.

When heat is generated by the lithium battery 10 for a long time, the adhesive 12 bonding the lithium battery 10 and the wiring 11a deteriorates so that conductivity is decreased. When the electrical resistance of the adhesive 12 increases, the voltage that was borne primarily by the conductive polymer 11c in the beginning is also borne by the adhesive 12. Eventually, when the electrical resistance of the adhesive 12 becomes greater than the electrical resistance of the conductive polymer 11c, the adhesive 12 primarily bears the voltage. The thermal energy consumed by the conductive polymer 11c is reduced, the tripped state is released, and self-generation of heat draws towards an end. Thus, a state where the conductive polymer 11c fails is not reached and the safety of the circuit is maintained.

Figure 4:
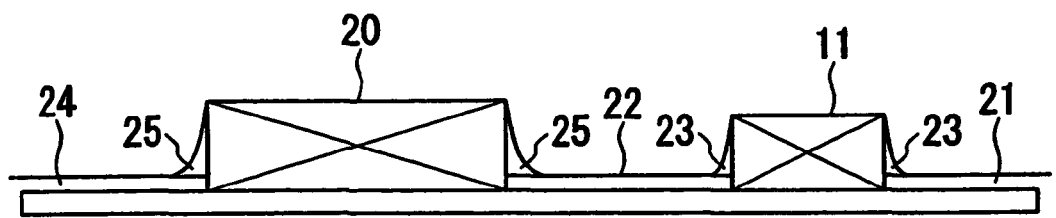
FIG. 4 shows a third embodiment of this invention, and is a plan view of a lithium battery mounted with a protection circuit with a printed circuit carrying the PTC thermistor being viewed cross-sectionally.

Next, a third embodiment of this invention, shown in FIG. 4, is explained. Structural elements already in explained in the embodiments above have been given the same legends and explanations have been omitted.

FIG. 4 shows a circuit constructed on a printed substrate. This circuit is provided with a capacitor (component) 20, and a PTC thermistor 11 with two electrodes, one of which is connected to an electrode of the capacitor 20. One end of the wiring 21 is soldered to one electrode of the PTC thermistor 11, and one end of the wiring 22 is soldered to the other electrode (the legend 23 is solder). The other end of the wiring 21 in connected to an unillustrated input side of the circuit. The other end of the wiring 22 is connected, in such a way that current flows, to an electrode on the capacitor 20 with an adhesive 25 similar to the adhesive explained in the above first and second embodiments. One end of the wiring 24 is bonded with an adhesive 25, in such a way that current will flow, to the other electrode of the capacitor 20. The other end of the wiring 24 is connected to an unillustrated output side of the circuit.

If excessive voltage is applied in the circuit as constructed above, excessive current flows between the two electrodes of the capacitor to make it heat up. At the same time, excessive current flows between the two electrodes of the PTC thermistor 11; the conductive polymer (not illustrated) comprising the PTC thermistor 11 expands thermally by self-generating heat through Joule heating so that it becomes difficult for current to flow between the two electrodes.

When heat is generated by the capacitor 20 for a long time, the adhesive 25 bonding the capacitor 20 and the wiring 22, 24 deteriorates so that conductivity is decreased. When the electrical resistance of the adhesive 25 increases, the voltage that was borne primarily by the conductive polymer in the beginning is also borne by the adhesive 25. Eventually, when the electrical resistance of the adhesive 25 becomes greater than the electrical resistance of the conductive polymer, the adhesive 25 primarily bears the voltage. The thermal energy consumed by the conductive polymer is reduced, the tripped state is released, and self-generation of heat draws towards an end. Thus, a state where the conductive polymer fails is not reached and the safety of the circuit is maintained.

In this embodiment, both wirings 22, 24 were bonded to the capacitor 20 with an adhesive 25, but a suitable effect may also be obtained by bonding either of the wiring with an adhesive 25 and connecting the other wiring by a bonding means such as welding or soldering and the like.

Also, in the second and third embodiments above, a lithium battery and a capacitor were used as examples for the component, but the component is not limited to these and may be any if it heats up when excessive current flows.

This invention relates to a PTC thermistor provided with a conductive member having PTC characteristics and two electrodes each placed in two different locations on the conductive member, characterized by the conductive member and at least one of the two electrodes being bonded via an adhesive which has conductivity and which at the same time deteriorates in an overheated state and irreversibly increases the electrical resistance.

According to the PTC thermistor of this invention, when heat generation of the conductive member continues for a long time, the adhesive bonding the conductive member and the electrodes deteriorates and the voltage that was borne primarily by the conductive member in the beginning is also borne by the adhesive. Eventually, when the electrical resistance of the adhesive becomes greater than the electrical resistance of the conductive member, the adhesive primarily bears the voltage. The thermal energy consumed by the conductive member is reduced, the tripped state is released, self-generation of heat draws towards an end, and a state where the conductive member fails is not reached.

Also, even when the PTC thermistor of this invention is placed under a very high temperature environment for a long time and the conductive member eventually fails, the adhesive will deteriorate by then and reduce its conductivity, and the adhesive between the two electrodes becomes an increased resistance and serves to reduce the current flowing between the electrodes, so that even when the conductive member fails, the two electrodes will not short circuit. Thus the reliability of the PTC thermistor may be improved and the safety of the circuit may be secured.

This invention relates to a circuit protection method that includes a component that generates heat through the flow of excessive current, characterized by a PTC thermistor being provided on the circuit and the wiring comprising the circuit being bonded to the component in such a way as to allow current to flow using an adhesive which has conductivity and which at the same time deteriorates in an overheated state and irreversibly increases the electrical resistance.

According to the circuit protection method of this invention, when heat is generated by the component for a long time, the adhesive bonding the component and the wiring deteriorates so that the voltage that was borne primarily by the PTC thermistor in the beginning is also borne by the adhesive. Eventually, when the electrical resistance of the adhesive becomes greater than the electrical resistance of PTC thermistor, the adhesive primarily bears the voltage. The thermal energy consumed by the PTC thermistor is reduced, the tripped state is released, self-generation of heat draws towards an end, and a state where the conductive member fails is not reached. Thus the PTC thermistor is protected and the safety of the circuit is secured.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A polymeric PTC thermistor comprising:
   a conductive member comprising a conductive polymer having PTC characteristics; and
   two electrodes each placed in two different locations on the conductive member;
   wherein the conductive member and at least one of the two electrodes are bonded via an adhesive which (i) comprises a synthetic resin, (ii) has conductivity, and (iii) deteriorates in an overheated state in a temperature range in which the conductive polymer thermally expands and irreversibly increases the electrical resistance.

2. A thermistor according to claim 1, wherein both of the two electrodes are bonded via the adhesive.

3. A thermistor according to claim 1, wherein another of the two electrodes is bonded to the conductive member via a weld.

4. A thermistor according to claim 1, wherein another of the two electrodes is bonded to the conductive member via solder.

5. A thermistor according to claim 1, wherein the synthetic resin comprises a thermoplastic resin.

6. A thermistor according to claim 5, wherein the thermoplastic resin comprises vinyl acetate resin, polyvinyl alcohol resin, acrylic resin, vinyl urethane resin, or mixtures thereof.

7. A thermistor according to claim 1, wherein the synthetic resin comprises a thermosetting resin.

8. A thermistor according to claim 7, wherein the thermosetting resin comprises urea resin, melamine resin, phenol resin, resorcinol resin, epoxy resin, silicone resin, α-olefin maleic acid anhydride resin, polyamide resin, polyimide resin, or mixtures thereof.

9. A thermistor according to claim 1, wherein the adhesive comprises a conductive powder.

10. A thermistor according to claim 9, wherein the conductive powder comprises gold, silver, nickel, or copper.

* * * * *